(12) United States Patent
Pinney

(10) Patent No.: US 6,654,297 B2
(45) Date of Patent: Nov. 25, 2003

(54) DEVICE AND METHOD FOR USING COMPLEMENTARY BITS IN A MEMORY ARRAY

(75) Inventor: David L. Pinney, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/279,448

(22) Filed: Oct. 24, 2002

(65) Prior Publication Data

US 2003/0043645 A1 Mar. 6, 2003

Related U.S. Application Data

(63) Continuation of application No. 09/829,140, filed on Apr. 9, 2001, now Pat. No. 6,549,476.

(51) Int. Cl.$^7$ ................................. G11C 7/00
(52) U.S. Cl. ..................... 365/190; 365/189.01
(58) Field of Search ................. 365/190, 189.01, 365/189.04, 203, 202

(56) References Cited

U.S. PATENT DOCUMENTS

| | | |
|---|---|---|
| 4,112,512 A | 9/1978 | Arzubi et al. |
| 4,459,685 A | 7/1984 | Sud et al. |
| 4,601,019 A | 7/1986 | Shah et al. |
| 5,144,584 A | 9/1992 | Hoshino |
| 5,291,443 A | 3/1994 | Lim |
| 5,339,273 A | 8/1994 | Taguchi |
| 5,373,475 A | 12/1994 | Nagase |
| 5,381,368 A | 1/1995 | Morgan et al. |
| 5,422,850 A | 6/1995 | Sukegawa et al. |
| 5,440,517 A | 8/1995 | Morgan et al. |
| 5,461,587 A | 10/1995 | Oh |
| 5,469,393 A | 11/1995 | Thomann |
| 5,471,430 A | 11/1995 | Sawada et al. |
| 5,502,675 A | 3/1996 | Kohno et al. |
| 5,528,539 A | 6/1996 | Ong et al. |
| 5,555,212 A | 9/1996 | Toshiaki et al. |
| 5,592,428 A | 1/1997 | Harrand et al. |
| 4,601,019 A | 9/1997 | Shah et al. |
| 5,689,465 A | 11/1997 | Sukegawa et al. |
| 5,689,467 A | 11/1997 | Hashimoto |
| 5,724,286 A | 3/1998 | Gillingham |
| 5,754,486 A | 5/1998 | Nevill et al. |
| 5,781,483 A | 7/1998 | Shore |
| 5,936,874 A | 8/1999 | Clampitt et al. |
| 6,005,816 A | 12/1999 | Manning et al. |
| 6,044,029 A | 3/2000 | Shore |
| 6,075,737 A | 6/2000 | Mullarkey et al. |
| 6,075,743 A | 6/2000 | Barth et al. |
| 6,122,213 A | 9/2000 | Shore |
| 6,243,311 B1 * | 6/2001 | Keeth .................. 365/206 |
| 6,285,618 B1 | 9/2001 | Shore |

FOREIGN PATENT DOCUMENTS

WO    WO 97/28532    8/1997

OTHER PUBLICATIONS

Keeth et al., "DRAM Circuit Design," IEEE Press, 2001, pp. 35–43.

* cited by examiner

Primary Examiner—Thong Le
(74) Attorney, Agent, or Firm—Leffert Jay & Polglaze, P.A.

(57) ABSTRACT

An apparatus and method of operating an open digit line and a folded digit line DRAM memory array having a plurality of memory cells wherein, in a plan view, each memory cell, in one embodiment, has an area of $6F^2$. One method comprises, storing a first bit in a first memory cell and storing a second bit that is complementary to the first bit in a second memory cell. The first bit and the second bit form a data bit. The data bit is read by comparing a voltage difference between the first memory cell and the second memory cell.

15 Claims, 12 Drawing Sheets

DEVICE AND METHOD FOR USING COMPLEMENTARY BITS IN A MEMORY ARRAY

CONTINUATION INFORMATION

The present application is a continuation of U.S. patent application Ser. No. 09/829,140, filed Apr. 9, 2001, now U.S. Pat. No. 6,549,476.

TECHNICAL FIELD OF THE INVENTION

The present invention relates in general to memory arrays and in particular to storing two bits for each data bit in a memory array.

BACKGROUND OF THE INVENTION

Memory devices are typically provided as internal storage areas in the computer. There are several different types of memory. One type of memory is random access memory (RAM) that is typically used as main memory in a computer environment. Most RAM is volatile, which means that it requires a steady flow of electricity to maintain its contents.

A dynamic random access memory (DRAM) is a type of RAM. A DRAM memory is made up of memory cells. Each cell or bit includes a transistor and a capacitor. A cell is capable of storing information in the form of a "1" or "0" bit as an electrical charge on the capacitor. Since a capacitor will lose its charge over time, a memory device incorporating a DRAM memory must include logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

While a cell is being refreshed it cannot be read by a processor. This causes systems incorporating DRAMS to be slower than systems incorporating RAMS. However, DRAMS are more commonly used than RAMS because their circuitry is simpler and because they can hold up to four times as much data. Another disadvantage in using a typical DRAM is the amount of power needed to constantly refresh the cells. This disadvantage becomes more crucial as apparatuses incorporating memory devices are designed to use less and less power.

For the reasons stated above, and for other reasons stated below which will become apparent to those skilled in the art upon reading and understanding the present specification, there is a need in the art for a DRAM memory device whose cells can go for an extended period of time without having to be refreshed

SUMMARY OF THE INVENTION

The above-mentioned problems with non-volatile memory devices and other problems are addressed by the present invention and will be understood by reading and studying the following specification.

In one embodiment, a method of operating a DRAM memory array having a plurality of memory cells wherein, in a plan view, each memory cell has an area of less than $8F^2$ comprises storing a first bit in a first memory cell, and storing a second bit that is complementary to the first bit in a second memory cell. The method includes pre-charging and equilibrating first and second digit lines to an intermediate voltage level, sharing a charge on a capacitor of the first memory cell with the first digit line, and sharing a charge on a capacitor of the second memory cell with the second digit line. A voltage difference between the first digit line and the second digit line is compared with a sense amplifier.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

The present invention operates a DRAM memory array in a half density mode. That is, the present invention uses two cells of the memory array to store each data bit. Although this approach reduces the overall capacity of the memory in half, it effectively expands the period of time needed between refreshes of the memory cells. This leads to numerous advantages over the prior art. To better understand the present invention, further background is first provided.

Figure 1:
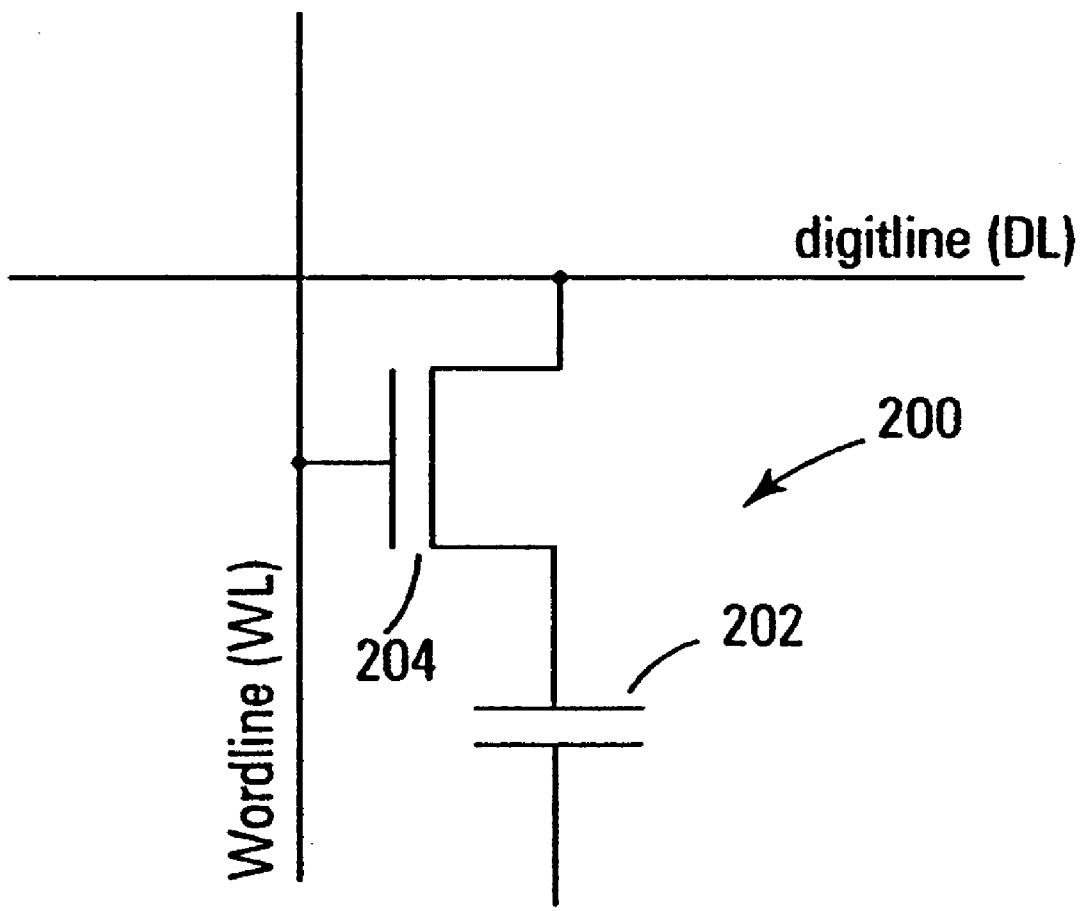
FIG. 1 is a schematic diagram of a DRAM memory cell of the prior art.

Referring to FIG. 1, a DRAM memory cell 200 is illustrated. The cell 200 is illustrated as having a capacitor 202 and an access transistor 204. The capacitor 202 is used to store a charge. The charge represents a bit of information. The access transistor 204 acts as a switch for the capacitor 202. That is, the access transistor 204 controls when a charge is placed on the capacitor 202, and when a charge is discharged from the capacitor 202. A word line is coupled to a control gate of the access transistor 204. When a cell is read, the word line activates the control gate of the transistor 204. Once this happens, any charge (or lack of charge) stored on the capacitor 202 is shared with a conductive digit line coupled to the drain of the access transistor 204. This charge is then detected in the digit line by a sense amplifier and then processed to determine the bit state of the cell 200. Tiling a selected quantity of cells together, such that the cells along a given digit line do not share a common word line and the cells along a common word line do not share a common digit line, forms a memory array. A typical memory array contains thousands or millions of cells.

Figure 2:
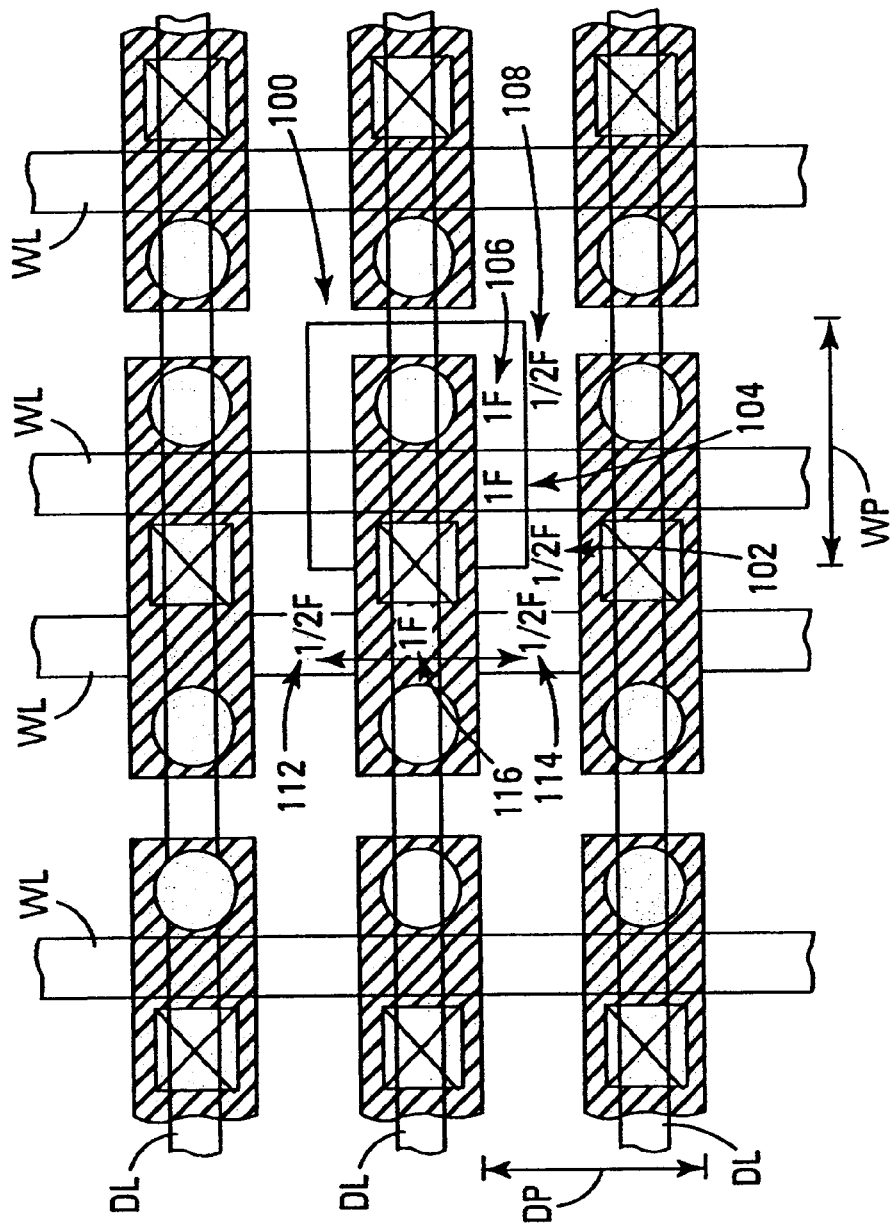
FIG. 2 is a plan view diagram of an open digit line architecture of the prior art.

A plan view of a portion of a DRAM memory array is illustrated in FIG. 2. In this example of a DRAM memory array layout, cells are paired to share a common contact to the digit line (DL), which reduces the array size by eliminating duplication. This layout is arranged in an open digit line architecture wherein each memory cell 100 has an area equal to $6F^2$. That is, the area of a memory cell 100 in this layout is described as $6F^2$. As illustrated in FIG. 2, a box is drawn around a memory cell 100 to show the cell's outer boundary. Along the horizontal axis of the memory cell 100, the box includes one-half digit line contact feature 102, one word line feature 104, one capacitor feature 106, and one-half field oxide feature 108 for a total of three features. Along the vertical axis of the memory cell 100, the box contains two one-half field oxide features 112, 114 and one active area feature 116 for a total of two features. Therefore, the total area of a cell 100 is $3F*2F=6F^2$. Moreover, as FIG. 2 illustrates, pairs of cells in a row are isolated from other pairs of cells in the row. This is accomplished, in this example of an open digit line architecture, by grounding selective word lines (not shown). A discussion of DRAM circuit design including open digit line architecture is provided in Brent Keeth and Jacob Baker, *DRAM Circuit Design, A Tutorial,* 1–103 (IEEE Press 2001), which is incorporated herein by reference.

Figure 2A:
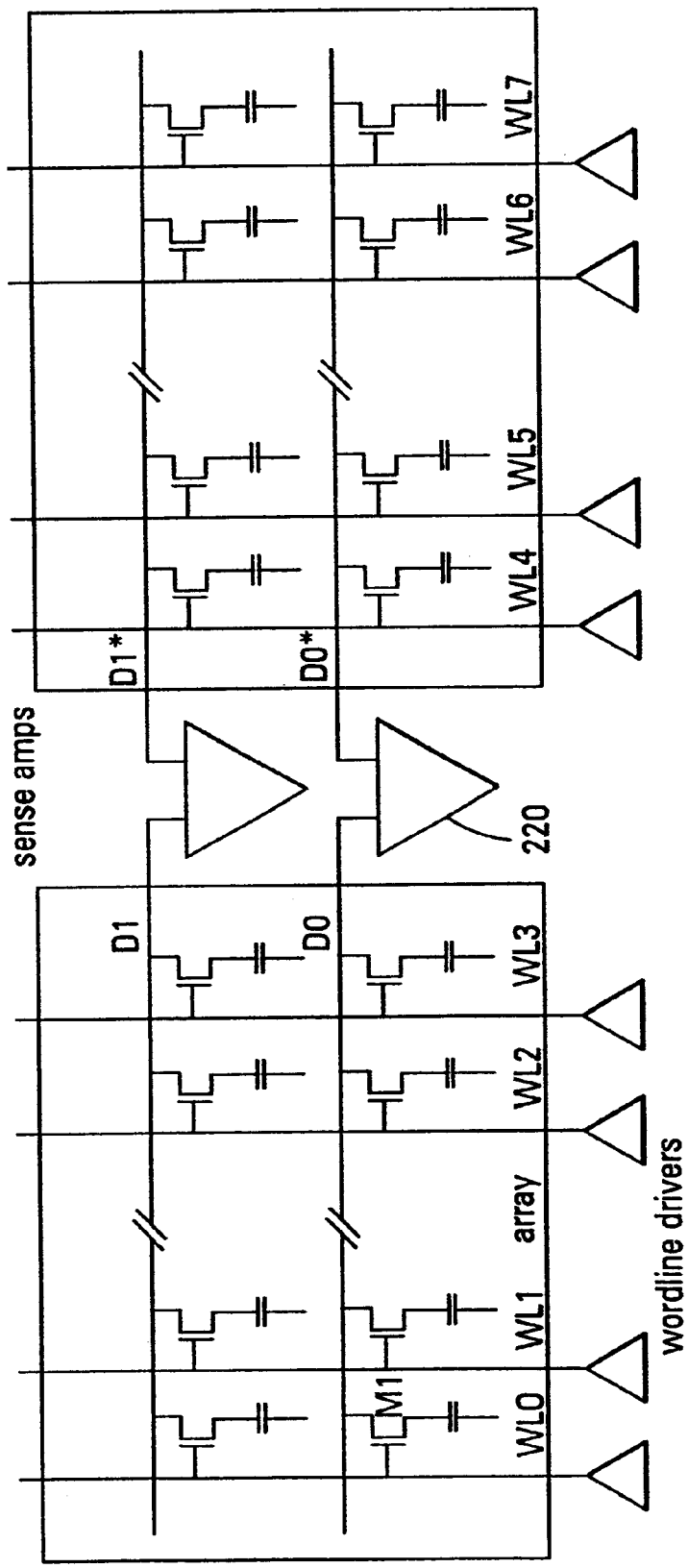
FIG. 2A is a schematic diagram of the physical layout of an open digit line architecture memory of the prior art.

Referring to FIG. 2A, a schematic diagram of portion of an open digit line DRAM array is illustrated, wherein the cells have an area of $6F^2$. As illustrated, sense amplifiers are coupled between digit line D1 and complementary digit line D1* and between D0 and complementary digit line D0*. Cells with a 1 bit can be expressed as having a +Vcc/2 stored on them and cells with a 0 bit can be expressed as having a −Vcc/2 stored on them. To read a memory cell, a digit line coupled to the cell and its complementary digit line are first initially equilibrated to Vcc/2 volts. Applying Vcc/2 bias voltage to the digit lines and then allowing the digit lines to float causes the digit lines to be equilibrated to Vcc/2 volts. Once the digit lines have been equilibrated to Vcc/2 volts, they remain in that state due to their capacitance. A voltage that is at least one transistor Vth above Vcc (this voltage is referred to as Vccp) is then applied to a word line coupled to the cell to be read. For example, if cell M1 is to be read, a voltage of Vccp is applied to word line WL0 after the digit lines D0 and D0* are equilibrated to Vcc/2. The charge on the capacitor of M1 is shared with digit line D0. In response to the shared charge, the voltage in digit line M1 either increases if cell M1 stored a 1 bit, or decreases if cell M1 stored a 0 bit. Thereafter, sense amplifier 220 compares the voltage in digit line D0 against the voltage in digit line D0*.

Figure 3:
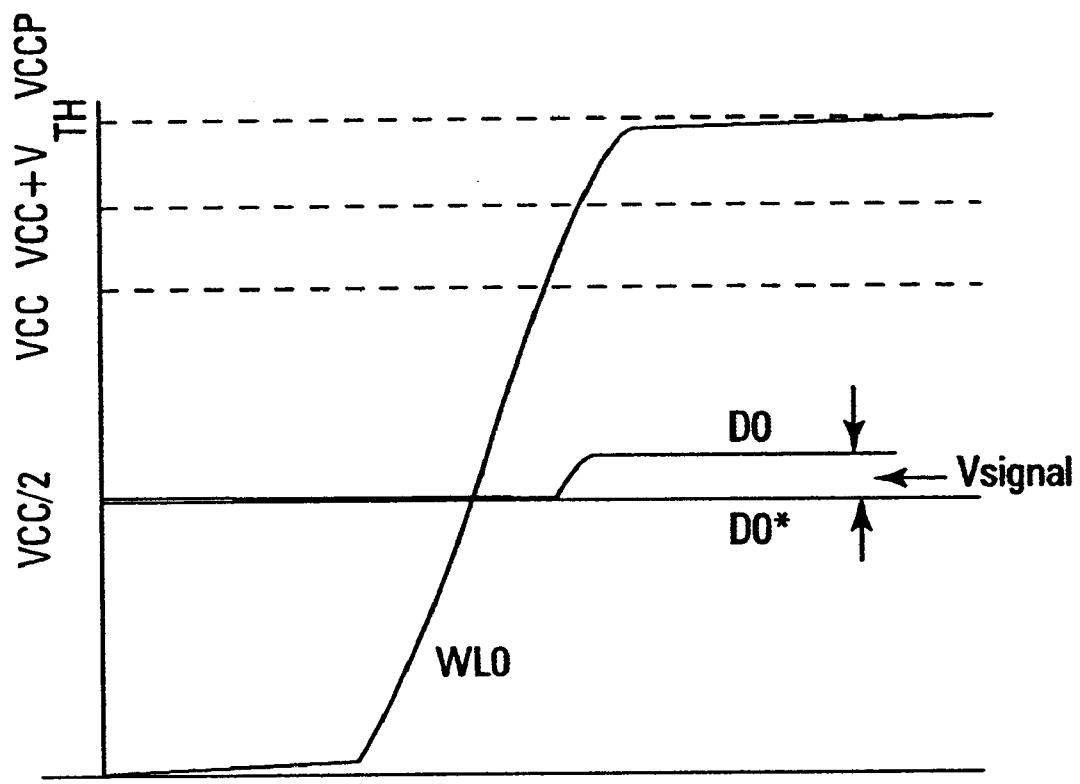
FIG. 3 is a table that illustrates the waveforms during a typical read or write operation in the prior art.

Referring to FIG. 3, the waveforms during a typical read or write operation are illustrated, wherein cell M1 has a 1 bit stored. The magnitude of the voltage difference or signal (Vsignal) between digit line D0 and digit line D0* is a function of the cell capacitance (Ccell), the digit line capacitance (Cdigit), and the voltage stored in the cell prior to access (Vcell). This can be expressed as Vsignal= (Vcell*Ccell)/(Cdigit+Ccell) volts. For example, a design in which Vcell=1.65V, Ccell=50 fF, and Cdigit=300 fF yields a Vsignal of 235 mV.

Figure 4:
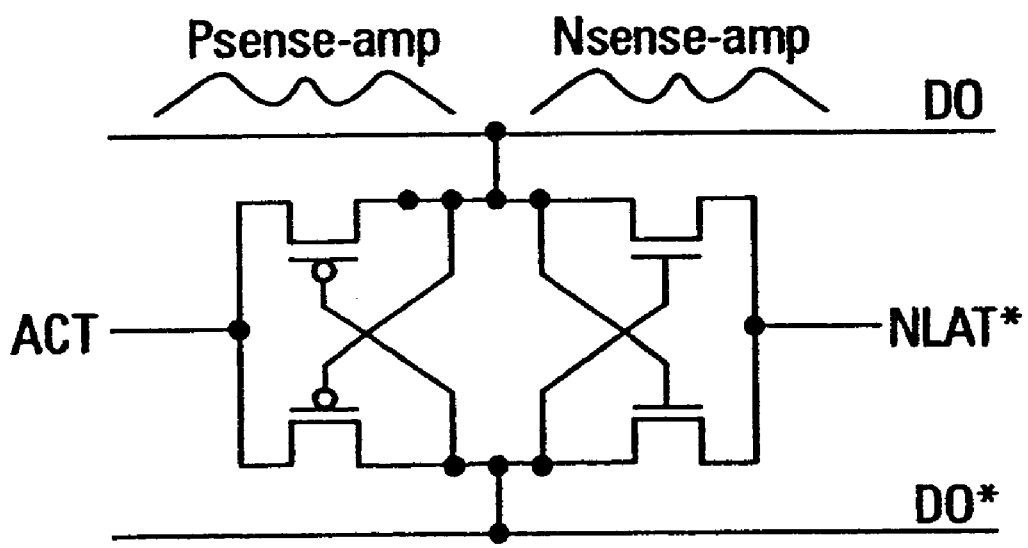
FIG. 4 is a schematic diagram of a typical sense amp of the prior art.

After the cell has been accessed, sensing occurs. Sensing is necessary to properly read the data and refresh the cells. A simplified illustration of a typical sense amplifier is shown in FIG. 4. As FIG. 4 illustrates, the sense amplifier includes a Psense-amp and a Nsense-amp. The Psense-amp includes a pMOS pair of transistors, and the Nsense-amp includes an nMOS pair of transistors. Also labeled in FIG. 4 is node ACT (for ACTive pull up) on the Psense-amp, and node NLAT* (Nsense-amp LATch) on the Nsence-amp. ACT and NLAT provide power and ground. Initially, NLAT* is biased to Vcc/2 and Act is biased to Vss or signal ground. Since, the digit line pair D0 and D0* are both at Vcc/2, the nMOS pair of transistors and the pMOS pair of transistors are turned off. When a cell is accessed that is coupled to either D0 or D0*, a voltage difference occurs between D0 and D0*. While one of the digit lines contains charge from the cell access, the other digit line serves as a reference for the sensing operation.

After the cell is accessed the sense amplifiers are generally fired sequentially, the Nsense-amp first, followed by the Psense-amp. The Nsense-amp is fired by bring NLAT* toward ground. As the voltage difference between NLAT* and the digit lines approaches Vth, the nMOS transistor whose gate is connected to the higher voltage digit line begins to conduct. This conduction causes the low-voltage digit line to be discharged toward the NLAT* voltage. Ultimately, NLAT* will reach ground, and the digit line will be brought to ground potential. Sometime after the Nsence-amp fires, the Psense-amp is activated by bring the ACT toward Vcc. The Psense-amp operates in a complementary fashion to the Nsense-amp. With the low-voltage digit line approaching ground, there is a strong signal to drive the appropriate pMOS transistor into conduction. This conduction charges the high-voltage digit line toward ACT, ultimately reaching Vcc. The capacitor of the cell being read is refreshed during the sensing operation. This is accomplished by keeping the access transistor of the cell on when the Psence-amp is activated. The charge the capacitor of the cell had prior to accessing the cell is fully restored. That is, the charge will be restored to Vcc for a 1 bit and GND for a 0 bit.

Figure 5:
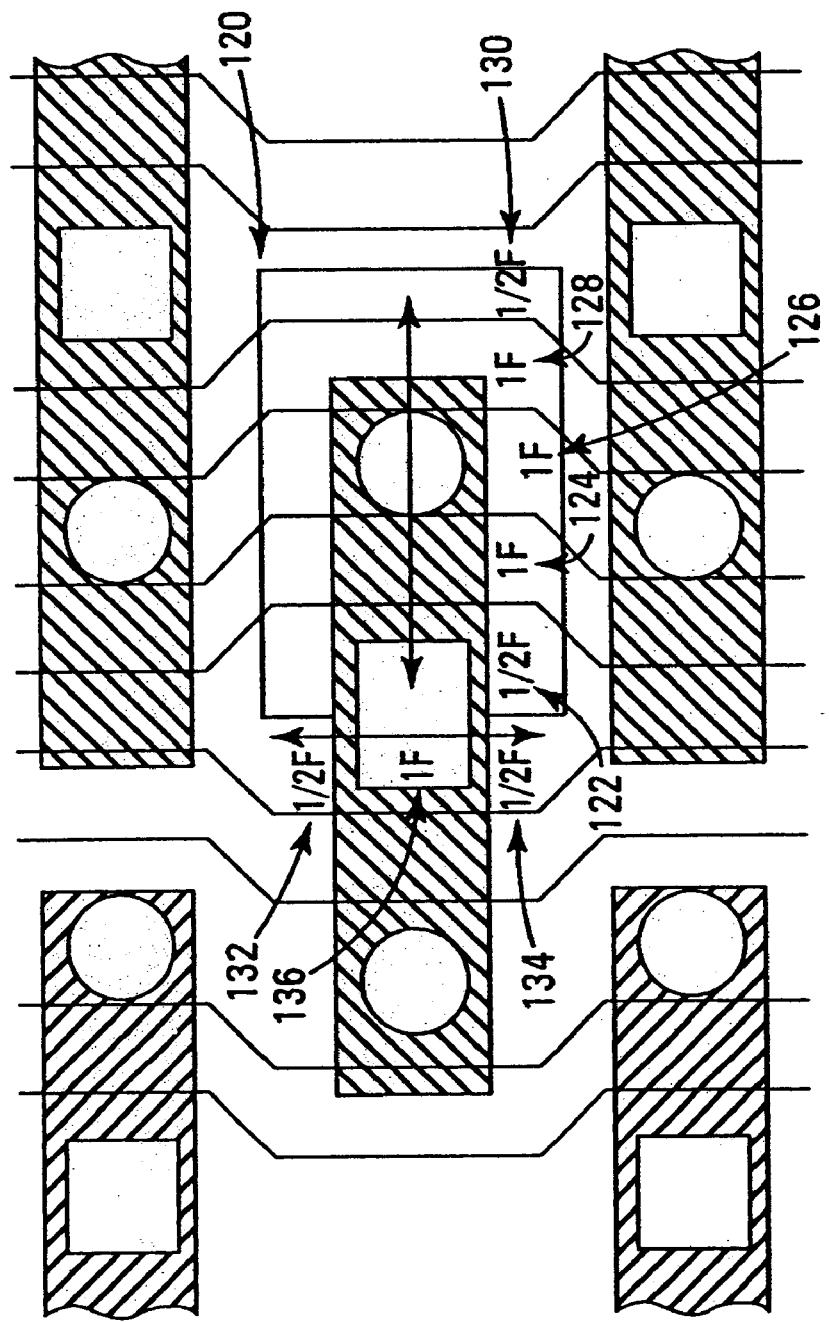
FIG. 5 is a plan view diagram of the physical layout of a folded line architecture memory in the prior art.

A commonly used architecture for a DRAM array is a folded line architecture. A plan view of a portion of a folded line architecture array is illustrated in FIG. 5. In this folded line architecture array, each cell is illustrated as having an area of $8F^2$. As illustrated, a box has been drawn in FIG. 5 to illustrate a cell's outer boundary. Along the horizontal axis of the memory cell 120, the box includes one-half digit line contact feature 122, one word line feature 124, one capacitor feature 126, one poly feature 128 and one-half field oxide feature 130 for a total of 4 features. Along the vertical axis of the cell 120, the box contains two one-half field oxide features 132, 134 and one active area feature 136 for a total of two features. Therefore, the area of the cell is $4F*2F=8F^2$.

Figure 5A:
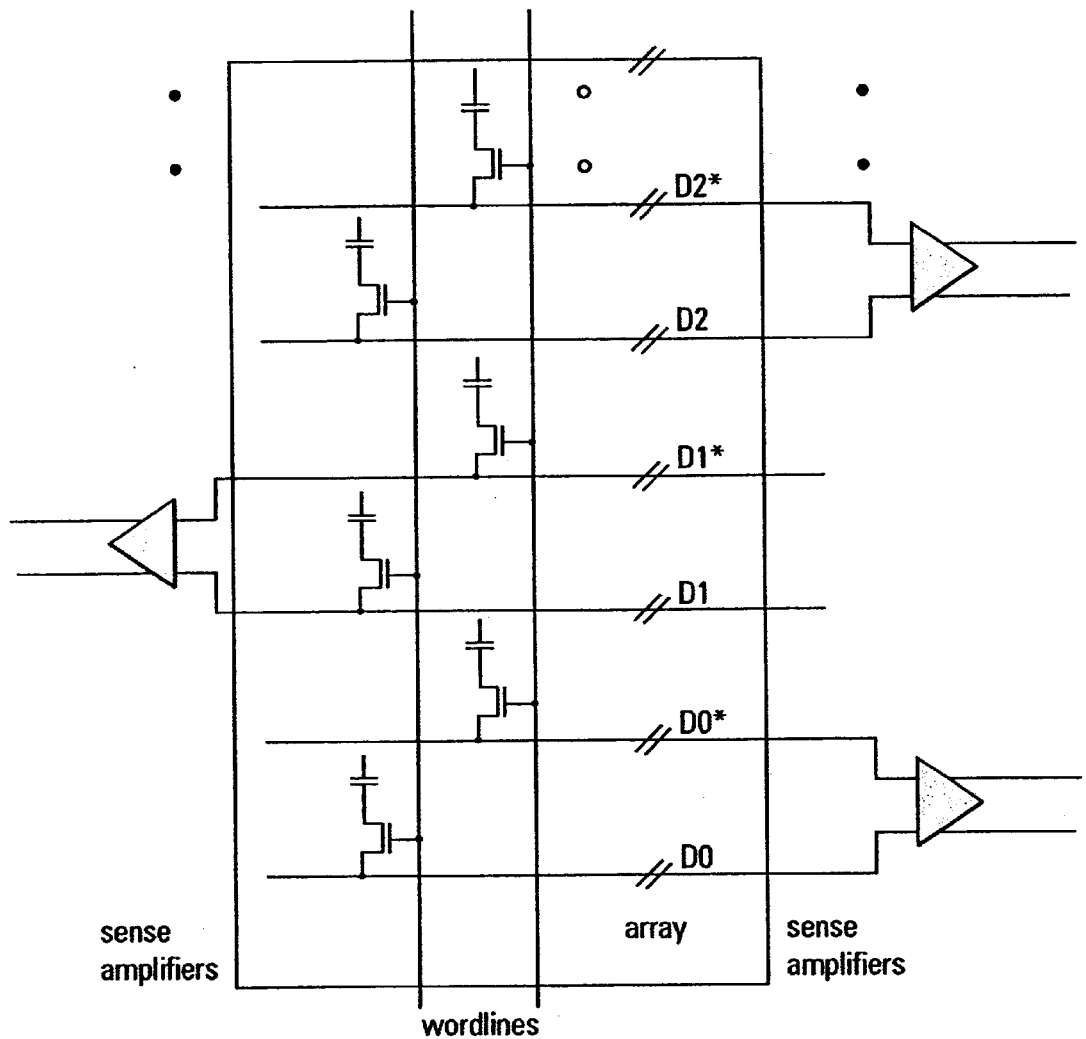
FIG. 5A is a schematic diagram of the physical layout of a folded line architecture memory in the prior art.

The increase in area of the $8F^2$ cells is due to the staggering of the cells in the array. Staggering the cells allows each word line to connect with a transistor of every other digit line. To accomplish this arrangement, each word line must pass around the access transistors on the remaining digit lines as field ploy. Thus, the staggering of the memory cells results in field poly in each cell that adds two square features. An $8F^2$ cell in a folded line architecture is approximately 25% larger than a $6F^2$ memory cell in an open digit line architecture. Referring to FIG. 5A, a schematic diagram of a folded line architecture is illustrated. FIG. 5A also illustrates how the sense amplifiers are coupled to the cells. Cells having areas of $8F^2$ are more commonly used in folded line architecture arrays than cells having $6F^2$ areas because they are generally less complicated to incorporate in dies.

Figure 6:
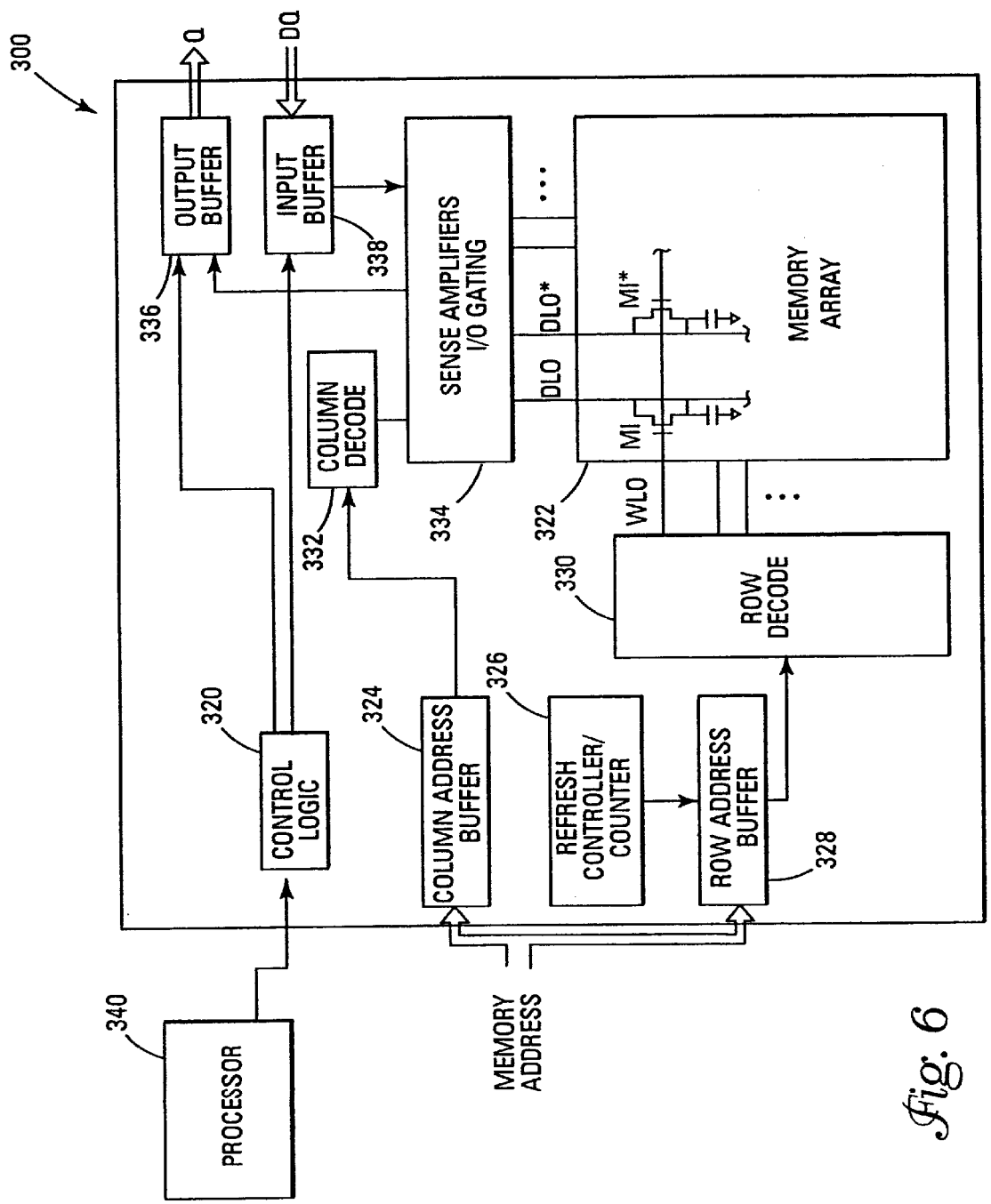
FIG. 6 is block diagram of a memory system of the present invention.

One embodiment of the present invention is illustrated in FIG. 6. FIG. 6 illustrates a simplified block diagram of the relevant parts of a DRAM memory system according to the present invention. A DRAM memory device 300 includes control logic circuit 320 to control read, write, erase and other memory operations. A column address buffer 324 and a row address buffer 328 are adapted to receive memory address requests. A refresh controller/counter 326 is coupled to the row address buffer 328 to control the refresh of the memory array 322. A row decode circuit 330 is coupled between the row address buffer 328 and the memory array 322. A column decode circuit 332 is coupled to the column address buffer 324. Sense amplifiers—I/O gating circuit 334 is coupled between the column decode circuit 332 and the memory array 322. The DRAM memory device 300 is also illustrated as having an output buffer 336 and an input buffer 338. An external processor 340 is coupled to the control logic circuit 320 of the memory device 300 to provide external commands.

Complementary cells M1 and M1* of the memory array 322 are shown in FIG. 6 to illustrate how pairs of associated memory cells are implemented in the present invention. Complementary states or charge are stored in the M1 and M1* that correspond to a data bit. A word line WL0 is coupled to the gates of the M1 and M1*. When the word line WL0 is activated, the charge stored in cell M1 is discharged to digit line DL0 and the charge stored in cell M1* is discharged to digit line DL0*. Digit line DL0 and Digit line DL0* are coupled to a sense amplifier in circuit 334. Although, M1 and M1* are illustrated as being coupled to one word line WL0 in FIG. 6, it will be appreciated by those in the art that a pair of complementary word lines (i.e., WL0 and WL0*) that are fired at the same time could be used, and the present invention is not limited to one word line for each pair of complementary cells.

Figure 7:
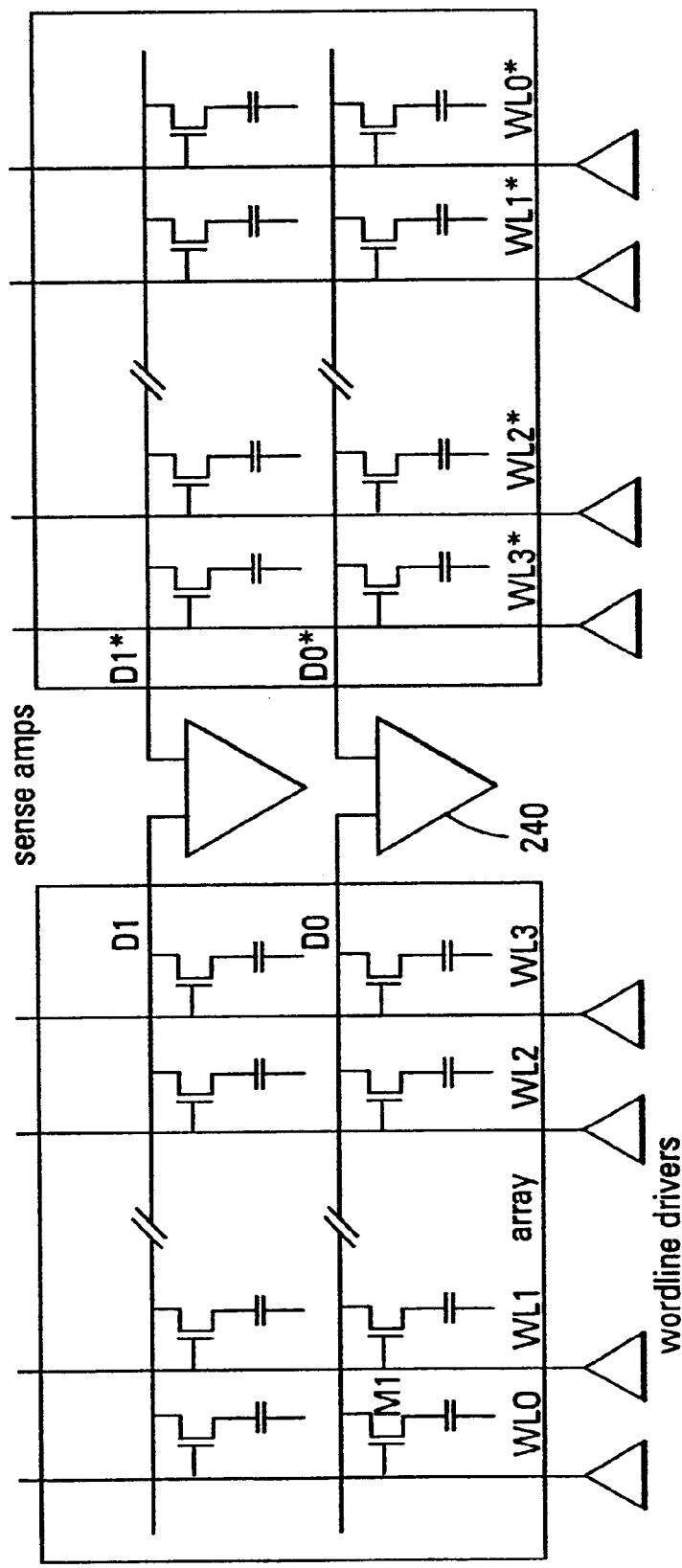
FIG. 7 is a schematic diagram of the physical layout of one embodiment of the present invention wherein the memory cells have an area of $6F^2$ in an open architecture digit line array.

Referring to FIG. 7, one embodiment of the present invention is illustrated. In this embodiment, an open digit line array architecture is used with memory cells having a $6F^2$ area. As stated above, the present invention stores two bits for one data bit wherein the bits are complementary to each other. That is, if one memory cell represents a 1 bit (for example, a charge of +Vcc/2), the complementary memory cell represents a 0 bit (for example, a charge of -Vcc/2). The present invention supplies the 1 bit to one digit line and the 0 bit to a complementary digit line wherein a double differential is supplied to a sense amplifier. For example, referring to FIG. 7, a data bit is stored in cells M1 and M1*. The charge stored in M1 is +Vcc/2 and the charge stored in M1* is -Vcc/2. In one embodiment, a refresh cycle is started by equilibrating digit lines D0 and D0* to Vcc/2. Word lines WL0 and WL0* are then fired simultaneously causing cells M1 and M1* to share their charge (or lack of charge) with their respective digit lines D0 and D0*. Sense amplifier 240 then compares the charge in digit line D0 with the charge in digit line D0* in determining the data bit. The refresh cycle is complete once the sense amplifier 240 causes cells M1 and M1* to be recharged to their respective +Vcc/2 and -Vcc/2 levels.

Figure 8:
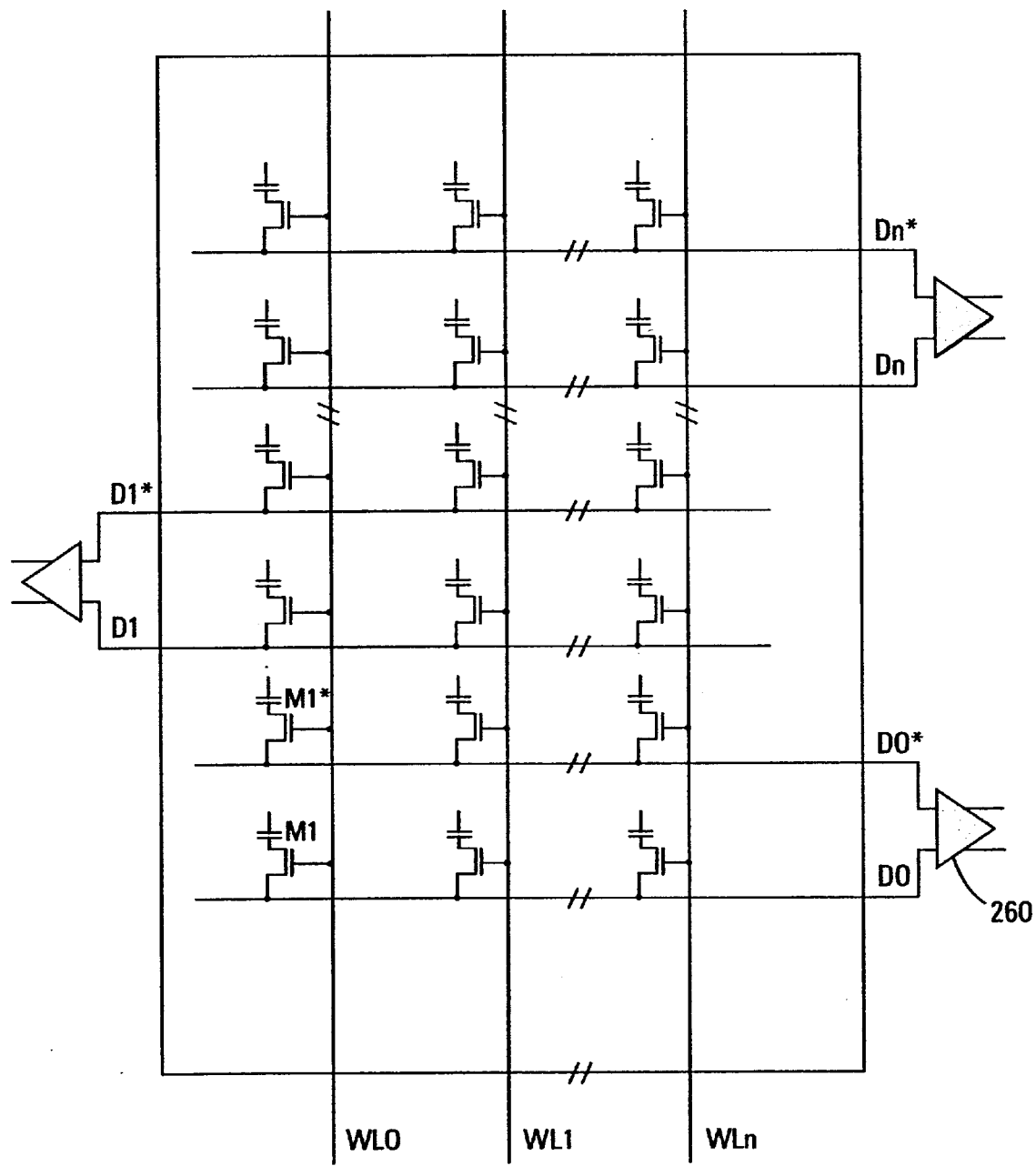
FIG. 8 is a schematic diagram of the physical layout of one embodiment of the present invention wherein the memory cells have an area of $6F^2$ in a folded architecture digit line array.

Referring to FIG. 8, another embodiment of the present invention is illustrated. In this embodiment, a folded digit line array architecture is used with cells having an area of $6F^2$. In this embodiment, a single word line is coupled to the gates of complementary cells. For example, as illustrated in FIG. 8, the single word line WL0 is coupled to the gates of cell M1 and cell M1*. When the word line WL0 is fired, cells M1 and M1* share their charge (or lack of charge) with their respective digit lines D0 and D0*. Sense amplifier 260 then compares the charge in digit line D0 with the charge in digit line D0* in determining the data bit. This embodiment may be desired because it requires only one word line to be fired in accessing a data bit.

Figure 9:
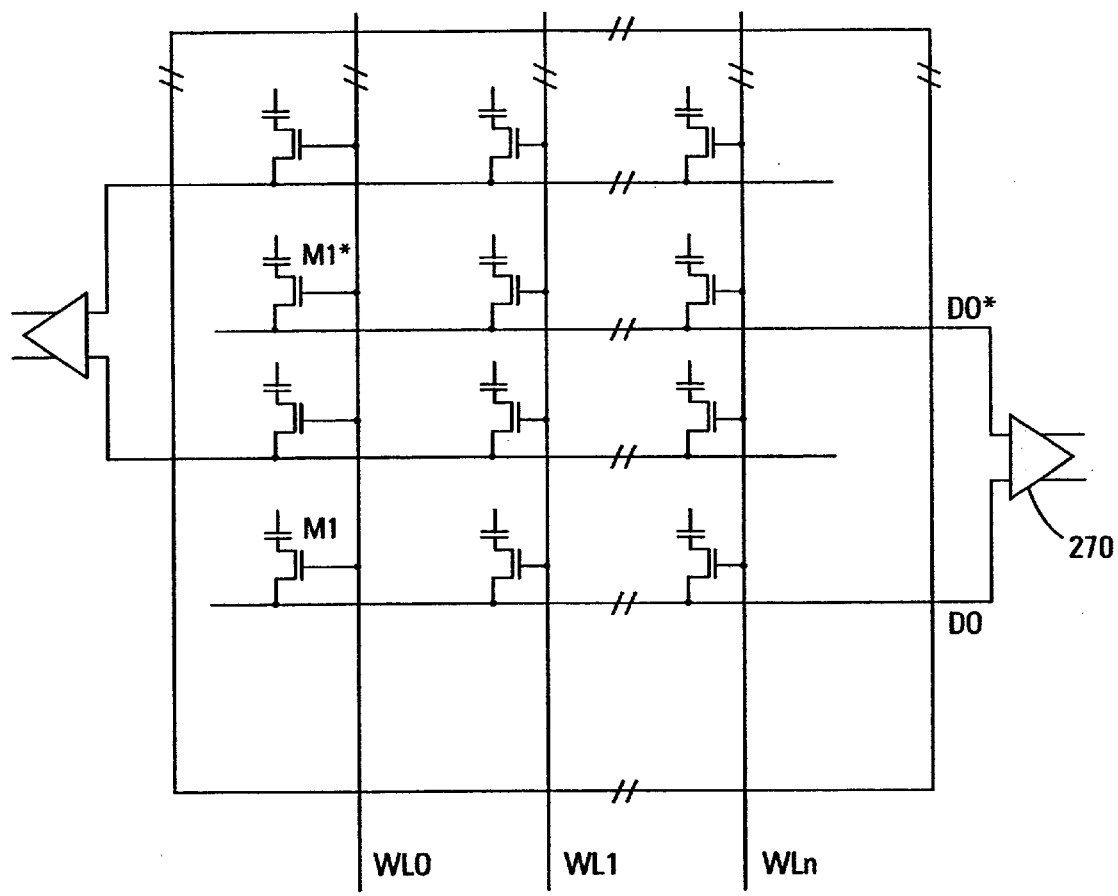
FIG. 9 is a schematic diagram of the physical layout of one embodiment of the present invention wherein the memory cells have an area of $6F^2$ in a folded digit line array, illustrating complementary memory cells not being located adjacent to each other.

FIG. 8 is illustrated having the complementary cells located directly adjacent with each other. In another embodiment having a folded digit line array with cells having an area of $6F^2$, the complementary cells are not positioned directly adjacent with each other. One example of this embodiment is illustrated in FIG. 9. As with the embodiment with the adjacent complementary cells, in this embodiment, the single word line WL0 is coupled to the gates of cell M1 and cell M1*. When the word line WL is fired, cells M1 and M1* share their charge (or lack of charge) with their respective digit lines D0 and D0*. Sense amplifier 270 then compares the charge in digit line D0 with the charge in digit line D0* in determining the data bit.

Figure 10:
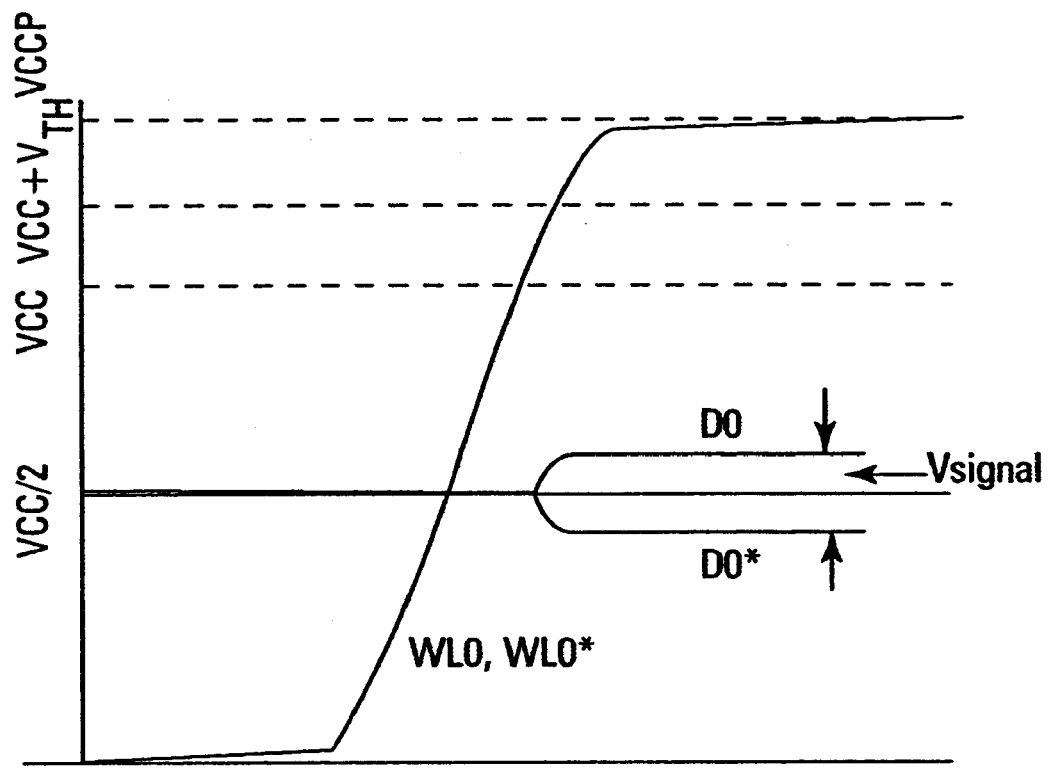
FIG. 10 is a table that illustrates the waveforms during a read or write operation of one embodiment of the present invention.

Referring to FIG. 10, the waveforms during a read or refresh operation of the present invention is illustrated. The magnitude of the voltage difference or signal difference (Vsignal) between digit line D0 and digit line D0* is double the difference as would be found if one of the digit lines were only used as a reference, i.e. Vcc/2, as in the prior art. As previously discussed, the magnitude of Vsignal= (Vcell*Ccell)/(Cdigit+Ccell). As previously shown, a design having Vcell=1.65, Ccell=50 fF, and Cdigit=300 fF yeilds a Vsignal-D0 of 235 mV (for digit line D0 from reference Vcc/2). In the present invention, the magnitude of Vsignal-D0* in which Vcell=−1.65, Ccell=50 fF, and Cdigit=300 fF yields a Vsignal-D0* of −235mV (for digit line D0* from reference Vcc/2). Therefore, the total magnitude of Vsignal-total will be 470 mV. That is, the total signal difference in D0 and D0*, as sensed by an associated sense amplifier in this example, will be 470 mV.

Although the present invention reduces the overall storage capacity of a DRAM memory array by half, other significant advantages are created. For example, a significant increase in the period required between refreshing cycles of the cells is encountered. A typical refresh rate is around 200 ms in the prior art. Although it would be expected that an increase in the refresh rate would be encountered due to the doubling of the voltages difference supplied to the sense amps, the refresh rate of the present invention is, unexpectedly, approximately a second. Extending the refresh rate out this far allows the memory device to use substantially less power. Moreover, the gains in the refresh rate and less power consumption overcomes the limitations of manufacturing dies having folded digit line architecture arrays with cell areas of $6F^2$. In addition, although the present invention was described as using memory cells with areas of $6F^2$, it will be appreciated in the art that memory cells with areas less than $8F^2$ could be substituted with similar results and the present invention is not limited to memory cells having and area of $6F^2$.

Another benefit of the present invention is that it effectively deals with defective memory cells. By using complementary memory cells, the likelihood of successfully storing the data bit is enhanced because, even if one cell is defective and cannot hold a full charge, the complementary cell will provide enough charge to provide a differential for an associated sense amplifier to detect. Therefore, less redundancy elements are needed in the memory array.

CONCLUSION

An apparatus and method of operating an open digit line and a folded digit line DRAM memory array having a plurality of memory cells wherein, in a plan view, each memory cell, in one embodiment, has an area of $6F^2$, has been described. One method comprises storing a first bit in a first memory cell and storing a second bit that is complementary to the first bit in a second memory cell. The first bit and the second bit form a data bit. The data bit is read by comparing a voltage difference between the first memory cell and the second memory cell.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a DRAM memory array having a plurality of memory cells wherein, in a plan view, each memory cell has an area of less than $8F^2$ comprising:

storing a first bit in a first memory cell;

storing a second bit that is complementary to the first bit in a second memory cell;

pre-charging and equilibrating first and second digit lines to an intermediate voltage level;

sharing a charge on a capacitor of the first memory cell with the first digit line;

sharing a charge on a capacitor of the second memory cell with the second digit line; and comparing a voltage difference between the first digit line and the second digit line with a sense amplifier.

2. The method of claim 1 further comprising:

restoring charge to the capacitor of the first memory cell; and restoring charge to the capacitor of the second memory cell.

3. The method of claim 1 wherein the DRAM memory array is arranged in a folded digit line architecture.

4. The method of claim 1 wherein the DRAM memory array is arranged in an open digit line architecture.

5. The method of claim 1 wherein the intermediate voltage level is half of a supply voltage, Vcc.

6. A method of operating a DRAM memory array having a plurality of memory cells wherein, in a plan view, each memory cell has an area of less than $8F^2$ comprising:

charging a first capacitor of a first memory cell;

discharging a second capacitor of a second memory cell;

pre-charging and equilibrating first and second digit lines to an intermediate voltage level;

coupling the first capacitor to the first digit line to increase the voltage of the first digit line;

coupling the second capacitor to the second digit line to decrease the voltage of the second digit line; and detecting a voltage difference between the first digit line and the second digit line with a sense amplifier.

7. The method of claim 6 wherein the DRAM memory array is arranged in either a folded digit line architecture, or an open digit line architecture.

8. The method of claim 6 wherein the intermediate voltage level is half of a supply voltage, Vcc.

9. A DRAM memory device having a memory array of memory cells wherein, in a plan view, each memory cell has an area of less than $8F^2$, the DRAM memory device comprises:

a first memory cell;

a second memory cell;

write circuitry to store one bit of data in the memory array, wherein the write circuitry programs the first memory cell to a first data state and programs the second memory cell to a second complimentary data state; and read circuitry to simultaneously read the programmed first and second memory cells to detect the one bit of data comprising the first data state and the second complementary data state.

10. The DRAM of claim 9 wherein the read circuitry comprises a sense amplifier coupled to first and second digit lines, wherein the first and second digit lines are coupled to the first and second memory cells, respectively.

11. The DRAM of claim 10 wherein the read circuitry further comprises precharge circuitry to equilibrate the first and second digit lines to a predetermined voltage level before the one bit of data is read.

12. The DRAM of claim 9 wherein the first data state is a charged memory cell capacitor and the second complementary data state is an uncharged memory cell capacitor.

13. A DRAM memory device comprising:

a memory array of memory cells wherein, in a plan view, each memory cell has an area of less than $8F^2$;

a first memory cell of the array comprising an access transistor coupled to a first digit line and a storage capacitor;

a second memory cell of the array comprising an access transistor coupled to a second digit line and a storage capacitor;

write circuitry to store one bit of data in the memory array, wherein the write circuitry programs the first memory cell to a first data state and programs the second memory cell to a second complimentary data state;

read circuitry to simultaneously read the programmed first and second memory cells to detect the one bit of data comprising the first data state and the second complimentary data state; and precharge circuitry to equilibrate the first and second digit lines to a predetermined voltage level before the one bit of data is read.

14. The DRAM of claim 13 wherein the memory cells of the array are arranged in a folded digit line architecture.

15. The DRAM of claim 13 wherein the memory cells of the array are arranged in an open digit line architecture.

* * * * *